United States Patent
Tanzmeister

(10) Patent No.: US 10,192,008 B2
(45) Date of Patent: Jan. 29, 2019

(54) DETECTING STATIC AND DYNAMIC OBJECTS

(71) Applicant: Bayerische Motoren Werke Aktiengesellschaft, Munich (DE)

(72) Inventor: Georg Tanzmeister, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 489 days.

(21) Appl. No.: 14/698,313

(22) Filed: Apr. 28, 2015

(65) Prior Publication Data

US 2015/0310146 A1  Oct. 29, 2015

(30) Foreign Application Priority Data

Apr. 29, 2014 (DE) ........................ 10 2014 208 009

(51) Int. Cl.
| | | |
|---|---|---|
| *G01V 8/10* | (2006.01) | |
| *G06F 17/50* | (2006.01) | |
| *G06F 17/18* | (2006.01) | |
| *G08G 1/16* | (2006.01) | |

(52) U.S. Cl.
CPC ............ *G06F 17/5009* (2013.01); *G01V 8/10* (2013.01); *G06F 17/18* (2013.01); *G08G 1/165* (2013.01); *G08G 1/166* (2013.01); *G08G 1/167* (2013.01)

(58) Field of Classification Search
CPC ........ G08G 1/165; G08G 1/166; G08G 1/167; G06F 17/18; G06F 17/5009; G06F 17/50; G01V 8/10
See application file for complete search history.

(56) References Cited

U.S. PATENT DOCUMENTS

2015/0254985 A1*  9/2015  Fisher ................... G08G 1/166
                                                              348/148

OTHER PUBLICATIONS

R. Danescu, F. Oniga and S. Nedevschi, "Modeling and Tracking the Driving Environment With a Particle-Based Occupancy Grid," in IEEE Transactions on Intelligent Transportation Systems, vol. 12, No. 4, pp. 1331-1342, Dec. 2011. doi: 10.1109/TIE.2011.2158097.*
S. h. P. Won, W. W. Melek and F. Golnaraghi, "A Kalman/Particle Filter-Based Position and Orientation Estimation Method Using a Position Sensor/Inertial Measurement Unit Hybrid System," in IEEE Transactions on Industrial Electronics, vol. 57, No. 5, pp. 1787-1798, May 2010. doi: 10.1109/TIE.2009.2032431.*

(Continued)

*Primary Examiner* — Omar F Fernandez Rivas
*Assistant Examiner* — Joshua E. Jensen
(74) *Attorney, Agent, or Firm* — Crowell & Moring LLP

(57) ABSTRACT

For detecting static and dynamic objects, the objects are statistically detected by way of a particle card, and new particles are respectively added in repeating steps. The method is characterized by the fact that static particles are also added, which makes it possible to model static objects in a very precise manner. An environmental model is also generated that has a two-dimensional arrangement of cells, and each cell represents a specific location. To each cell at least two continuous classification values are assigned that describe different attributes of the cells, for example, whether a cell has an object, a static object, a dynamic object, or whether it represents a free space, or whether none of these classes can be assigned.

15 Claims, 1 Drawing Sheet

(56) References Cited

OTHER PUBLICATIONS

Danescu, Radu, Florin Oniga, and Sergiu Nedevschi. "Modeling and tracking the driving environment with a particle-based occupancy grid." IEEE Transactions on Intelligent Transportation Systems 12.4 (2011): 1331-1342. (Year: 2011).*
Won, Seong-hoon Peter, Wael William Melek, and Farid Golnaraghi. "A Kalman/particle filter-based position and orientation estimation method using a position sensor/inertial measurement unit hybrid system." IEEE Transactions on Industrial Electronics 57.5 (2010): 1787-1798. (Year: 2010).*
German Search Report dated Dec. 1, 2014, with English translation (Twelve (12) pages).
Moras et al., "Moving Objections Detection by Conflict Analysis in Evidential Grids", 2011 IEEE Intelligent Vehicles Symposium (IV) Baden-Baden, Germany, Jun. 5-9, 2011, pp. 1122-1127(Six (6) pages).
Danescu, et al. "Modeling and Tracking the Driving Environment With a Particle-Based Occupancy Grid", IEEE Transactions on Intelligent Transportation Systems, vol. 12, No. 4, Dec. 2011, pp. 1331-1342, (Twelve (12) pages).
Danescu, et al., "Particle Grid Tracking System Stereovision Based Obstacle Perception in Driving Environments", IEEE Intelligent Transportation Systems Magazine, vol. 4, No. 1, pp. 6-20, 2012, (Fifteen (15) pages).

\* cited by examiner

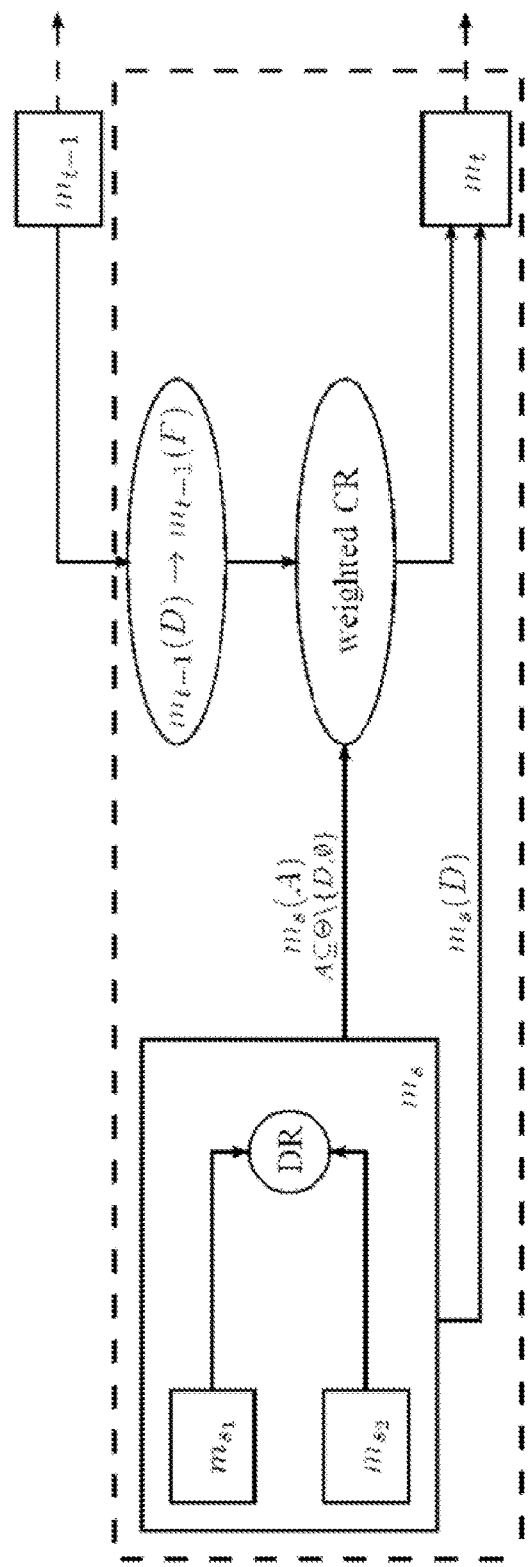

DETECTING STATIC AND DYNAMIC OBJECTS

CROSS REFERENCE TO RELATED APPLICATION

This application claims priority under 35 U.S.C. § 119 from German Patent Application No. 10 2014 208 009.6, filed Apr. 29, 2014, the entire disclosure of which is herein expressly incorporated by reference.

BACKGROUND AND SUMMARY OF THE INVENTION

The present invention relates to a method and device for detecting static and dynamic objects.

There are different driver assistance systems that assist the driver of a motor vehicle by controlling the motor vehicle in a partially automated or fully automated manner. Such driver assistance systems are, for example, lane-change assistance, braking assistance, emergency or collision-avoidance assistance, and driver assistance systems for driving a motor vehicle in a fully or partially automated manner.

In order to enable driving assistance systems to partially or fully control a vehicle, automated methods have been developed by which static and dynamic objects can be detected, in particular, objects that are located in the area of the vehicle trajectory. The conventional methods were designed mostly to detect either static or dynamic objects. Since the detection of objects must be carried out in real time and static and dynamic objects have different requirements of the system, in the past it has not been possible to simultaneously detect both static and dynamic objects simply and quickly in real time with one single system and with a precision which makes it possible to control a motor vehicle in a partially or fully automated manner. Dynamic objects are in motion and, therefore, must be able to be detected and tracked along their course of motion, the trajectory. The detection of the objects is to be so precise that dynamic objects are recognized as such.

On the other hand, the location of static objects must be precisely recognized and detected so that a collision with a static object can be reliably avoided.

For detecting dynamic objects, sensors that measure the velocity of the objects so that the motion of the objects can be measured and detected are preferably used. For this purpose, in particular, radar is used as a sensor. The spatial resolution of radar, however, is too imprecise for static objects. Therefore, for detecting static objects a laser scanner with which the location of the objects can be very precisely determined is preferably used; however, information about the velocity of the detected objects cannot be recorded.

From the publication R. Danescu et al, "Modeling and tracking the driving environment with a particle-based occupancy grid", IEEE TRANS. INTEL. TRANSP. SYST., Issue 12, No. 4, pages 1331-1342, December 2011, and the publication R. Danescu et al, "Particle grid tracking system stereo vision based obstacle perception in driving environments" IEEE INTEL. TRANSP. SYST. MAG., Issue 4, No. 1, pages 6-20, 2012, a method results which, by means of the Monte Carlo method, compares the location and the velocity of dynamic vehicles in a raster map and links them to measurements so that the location and the velocity of dynamic objects is detected in real time.

The present invention provides a method and a device for detecting static and dynamic objects, which method enables to detect both static and dynamic objects and is capable of being carried out in real time with little effort. And, the method is able to detect the location and the velocity of the static and dynamic objects with a precision necessary for controlling a vehicle in a partially automated or fully automated manner.

The object of the present invention is achieved by providing a method for detecting static and dynamic objects. The method includes the following steps:

a) distributing new particles in a particle card at a specific point in time (t), and the particle card is a two-dimensional arrangement of cells and each cell represents a specific location, each particle is represented by a velocity vector and the new particles are distributed in the particle card by a random process;

b) calculating the location of the particles at a later point in time (t+Δt) by a predetermined time step (Δt) vis-a-vis specific point in time (t) from step a) and assigning the particles to the cells of the particle card that correspond to the newly calculated location;

c) measuring the location of real objects by a sensor in an area including the locations of the particle card;

d) filtering the particles in the individual cells as a function of the measured objects, and in cells in which no object is measured, more particles are deleted than in cells in which an object is located;

e) repeating steps a) through d) and, in step a), new particles are added to the particles not deleted in step d).

The present invention is characterized by the fact that in step a) static particles having zero velocity are also added.

The present invention is a further refinement of the method by Danescus et at. explained at the outset. In this known method, new particles in a particle card are distributed with a uniform velocity distribution. Since the velocities are uniformly distributed, the probability of a velocity being exactly zero equals zero.

Static objects not in motion, therefore, cannot converge toward a specific velocity distribution and, thus, are not reliably detected.

The inventor of the present invention, however, has recognized that by adding static particles having zero velocity, static objects also may be detected without having to categorically change the method.

This method measures the location of real objects by use of a sensor. For this purpose, a sensor that merely measures the location but not necessarily the velocity suffices as the sensor. Such a sensor is, for example, a laser scanner. Thus, merely using a sensor measuring the location of objects, this method enables the simultaneous detection of both static and dynamic objects and the tracking of them in a particle card.

According to one preferred exemplary embodiment, after measuring the location of real objects in step c), in step a) only new particles are distributed in cells in which a real object has been measured. This method is a statistical method that, after repeating steps a) through d) several times, generates a particle card describing real objects by the velocity distributions of the particles in the cells, and the description converges with the real objects after repeating steps a) through d) several times. A faster convergence is reached by taking into account the location measurement of real objects in the distribution of new particles.

According to one preferred embodiment, the individual particles may be weighted, a weight representing a probability of a particle not being erased in step d). The weights, therefore, represent probabilities of survival in the filtering process according to step d). Particles having a higher weight have a greater probability of surviving and, therefore, weather the filtering in step d) better than particles having a lower weight.

Such a weight may be assigned, for example, by measuring the velocity of the objects, and the particles that are located at a location of a specific object and whose velocity, corresponding approximately to the measured velocity regarding the direction and/or magnitude, are assigned a higher weight than particles that are located at the location of the corresponding object; however, their velocity deviates more in regard to the direction and/or magnitude of the velocity. In this way, a faster convergence of the systems is reached.

Furthermore, weights may be assigned according to the life span of the individual particles. The longer a particle exists, the higher its respective weight. Preferably, an upper limit exists so that, after a predetermined number of steps in which a specific particle exists, no further increase of the weight occurs. The increase of the weight in relation to the life span of the particles may occur according to a linear function. It, however, may also be appropriate to carry out the increase according to a non-linear function, which first increases slowly, then features a stronger incline in one section until it reaches a section of saturation in which it does not further increase.

A further aspect of the present invention that may be used by itself or in conjunction with one of the aspects described further above relates to a method for detecting static and dynamic objects, including the following steps:

measuring the location of real objects by means of a sensor;

generating an environmental model that has a two-dimensional arrangement of cells and each cell represents a specific location, and at least two continuous classification values, describing the probability of a respective cell being assigned to a specific class, are assigned to the cells for respectively one specific time step (t), and in particular two or more of the following classes are differentiated as to whether the cell has an object;
whether the cell has a static object;
whether the cell has a dynamic object;
whether the cell represents a free space; and
whether the cell cannot be assigned to any of the aforementioned classes.

In particular, measuring the location of real objects by use of a sensor may occur according to one of the afore-described methods.

The environmental model in particular detects different features using the classification values of the cells regarding the objects included therein and tracks them over a plurality of time steps. Since a plurality of attributes of the cells or of the objects included therein are detected, a decision on the basis of the environmental model may be made more reliably in a driving assistance system.

The class for whether a cell has an object preferably does not include the class of cells having a static object or the cells having a dynamic object. The class of the cell that has an object thus includes all objects that are not defined as a static object or a dynamic object.

According to one preferred embodiment, the environmental model includes at least the classification values whether the cell has a static object, whether the cell has a dynamic object, and whether the cell represents a free space. With these classification values, decisions regarding static objects and dynamic objects may be made reliably in a driving assistance system, and the classification values describing the free space provide positive information about the area within which the vehicle may be moved.

The classification values are probabilities or, preferably, evidence masses according to the evidence theory of Dempster & Shafer.

Measuring the location of real objects is preferably evaluated according to free space in which locations in the area between a sensor and a real object are assessed as a free space. Accordingly, classification values are generated for the classes of the free space. For example, the measured coordinates of the location of the real objects and the coordinates of the respective sensor are considered in this evaluation.

Furthermore, it is possible to use the particle card explained above as a measurement of the location of the real objects and to convert it to an environmental model. In this particle card, static and dynamic objects are described by respective particles in the cells. In this way, classification values for the classes for whether the cell has a static object and whether the cell has a dynamic object may be derived from this particle card. For example, cells of the particle card are classified as cells including static objects when their particles have an average velocity below a predetermined threshold value and/or their particles have a velocity variance and/or a variance of the direction above a predetermined threshold.

In this method, two independent environmental models may be first generated, and one of the models includes classification values for the free space and the other environmental model includes classification values for static objects and dynamic objects. The environmental model having classification values for the static objects and dynamic objects is preferably generated from the particle card.

On the other hand, it is also possible to derive an environmental model from the particle card that has classification values for the free space as well as classification values for static objects and dynamic objects. In this embodiment, new particles are preferably distributed in the cells of the particle card according to the classification values for static objects and/or dynamic objects and/or according to the classification values for objects of which it is not determined whether they have dynamic or static objects. The classification values for the free space are not taken into account in the distribution of new particles. When the average velocity of the particles of a cell of a particle card is very low, then it is to be assumed that it is a static object. For static objects, the dynamic particles included in the cells have any direction of motion and the static particles have no direction of motion and, therefore, have a high variance regarding the direction of motion. Cells describing static objects have both, static particles and dynamic particles, and the dynamic particles may have any velocity so that the variance of the velocity is also relatively high. Cells describing dynamic particles in particular "survive" particles that have approximately the direction and velocity of the dynamic object. In this way, the variance in regard to the velocity and the direction of the particles of cells describing dynamic objects is small.

Therefore, in principle it is also possible to classify cells describing dynamic objects by means of the variance of the velocity and/or of the direction, the variance for this purpose being smaller than a specific threshold value. Cells describing dynamic objects may also be classified based on the average velocity of the particles when the average velocity is greater than a predetermined threshold value.

The threshold values in regard to the average velocity and/or regarding the velocity variance and/or the variance of the direction may be the same threshold values for classifying static and dynamic objects, and they are used as an upper limit on one occasion and as a lower limit on another. It may also be useful, however, to provide different threshold values for determining dynamic and static objects, and the threshold values regarding the variance for dynamic objects are preferably smaller than the threshold values of the variance of static objects. Cells whose variance is in the intermediate area between these two threshold values, therefore, may not be unequivocally assigned to the static or the dynamic objects.

Determining whether a cell describes a static object using the average velocity, the velocity variance and/or the variance of the direction is significantly more reliable than testing whether a cell includes an object in a plurality of consecutive steps and therefore concluding that this cell describes a static object. This is because dynamic objects moving at slow velocity and having a large footprint may lead to specific cells describing an object at a plurality of consecutive steps, even though this part of the object belongs to a dynamic object. If there is a desire to differentiate between static and dynamic objects in such a test, it would be necessary to determine the geometry of the objects and to review an object in its totality, that is, across a plurality of cells. This requires a significant calculation effort. In the method according to the present invention, the individual cells of the particle card are independent of one another other at each point in time t. Such a cellular system is significantly easier to calculate than a system having structures across cells.

Preferably, historical information is taken into account when generating the environmental model at a specific time step (t). This occurs using filtering of the environmental model with a time filter at previous time step (t−1). The classification values generated in this manner are combined with or linked to the classification values from the measurement of the location of the real objects. This linking and time filtering is preferably achieved using Jøsang's cumulative operator (see: A. Jøsang and S. Pope, "Dempsters rule as seen by little colored balls," Comput. Intell., Issue 28, No.: 4, pages 453-474, November 2012), which corresponds to a base filter and represents the Bayes filter in the evidence theory according to Dempster & Shafer.

Preferably, before filtering with the time filter in the environmental model at the previous time step (t−1), classification values for dynamic objects are assigned to the classification values for the free space and the classification values for dynamic objects are deleted. As dynamic objects are in motion, the area in which they were disposed in the past is a free space as long as no new dynamic object has moved into this area. Therefore, it may be taken as a general point of departure that areas occupied by dynamic objects in the past may be evaluated as free space in the future.

The classification values for dynamic objects derived from measuring the location of real objects are preferably entered directly, that is, without filtering or linking, into the environmental model at specific time step (t).

A system according to the present invention for detecting static and dynamic objects has a sensor for detecting the location of the objects, for example, a laser scanner, and a control device designed to carry out the method explained above.

The system may also have a sensor for detecting the velocity of the objects, for example, a radar.

Preferably, the system is a component of a driver assistance system of a motor vehicle, for example, a lane-change assistance, braking assistance, emergency or collision-avoidance assistance systems, of a system for automated driving or a driver assistance system for controlling the motor vehicle in a fully automated manner.

The method according to the present invention models neither trajectories nor objects, but the individual objects are illustrated merely in a cellular manner in a particle card. In this way, the problems of known methods, in which the data of specific objects or courses of motion have to be linked to one another, do not occur. It is not necessary to extract features or determine the shape of moving or static objects. Therefore, any objects, such as vehicles, pedestrians, cyclists, and dogs, may be reliably detected. Furthermore, the method according to the present invention is very selective and new objects added to the detected space may be very quickly recognized, for example, a vehicles crossing a street. As the method according to the present invention takes into account historical data using the step-by-step or repetitive modeling of the objects, even objects that are concealed in individual measurements may be reliably detected.

Other objects, advantages and novel features of the present invention will become apparent from the following detailed description of one or more preferred embodiments when considered in conjunction with the accompanying drawing.

BRIEF DESCRIPTION OF THE DRAWING

FIG. 1 shows schematically in a block diagram an exemplary method for generating an environmental model.

DETAILED DESCRIPTION OF THE DRAWING

The method according to the present invention provides for detecting static and dynamic objects, and first a particle card is generated. The particle card includes cells in a two-dimensional arrangement, each cell representing a specific location in the real world. The cells include cell values describing objects and/or free spaces that are located at the respective locations represented by the cells.

The method for generating such a particle card includes the following steps:
  a) distributing new particles in a particle card at specific time step (t), the particle card being a two-dimensional arrangement of cells and each cell representing a specific location, each particle being depicted by a velocity vector, and the new particles being distributed in the particle card by a random process;
  b) calculating the location of the particles at a later point in time (t+Δt) by a predetermined time step (Δt) vis-a-vis specific point in time (t) from step a) and assigning the particles to the cells of the particle card that correspond to the newly calculated location;
  c) measuring the location of real objects by means of a sensor in an area including the locations of the particle card;
  d) filtering the particles in the individual cells as a function of the objects measured, and more particles are deleted in the cells in which no object was measured than in cells in which an object is located;
  e) repeating steps a) through d), and in step a) new particles are added to the particles not deleted in step d).

In this method, static particles having zero velocity are also added in step a). For this purpose, for example, a Dirac impulse for the velocity having zero magnitude adds to the uniform velocity distribution, and the relative frequencies of the uniformly distributed velocities and of the velocity having zero magnitude may be specified using respective weighting factors.

Particle card (s2) is converted to an environmental model ($m_{S2}$).

An environmental model is a card having cells disposed in a two-dimensional arrangement, the cells corresponding with specific locations or the cells of the particle cards. The cell values of the environmental model include continuous classification values that describe how probable it is that the respective cell is assigned to a specific class. In this instance, the cells are assigned to the following classes:

a) a cell that has a static object $\{S\}$;
b) a cell that has a dynamic object $\{D\}$;
c) a cell that has a dynamic or static object $\{S, D\}$;
d) a cell that represents a free space $\{F\}$;
e) a cell of which it is not known whether it has a static object or a dynamic object or represents a free space and, therefore, may not be assigned to the aforementioned classes $\{\theta\}$.

The cell values of the environmental model are continuous cell values. In the present exemplary embodiment, the cell values are evidence masses according to the evidence theory of Dempster and Shafer. First, an evidence mass m(S) for the presence of a static object, an evidence mass m(D) for the presence of a dynamic object, and an evidence mass $m(\theta)$ for when such a cell may not be assigned to a static object and to a dynamic object are calculated for each cell. The evidence masses for a static object are calculated by the following formula:

$$m(S) = \frac{|X_S|}{n},$$

and $X_S$ is the number of all static particles of the respective cell, the particles having a velocity magnitude that is smaller or equal to a predetermined, lower threshold value velocity $\varepsilon$, and n being the total number of particles of the cell.

The evidence mass for dynamic objects is calculated with the following formula:

$$m(D) = \left(1 - \frac{|\sigma|}{\sigma_{max}}\right)\frac{|X_D|}{n},$$

and $X_D$ is the number of all dynamic particles of the respective cell whose velocity magnitude is greater than the threshold value $\varepsilon$, and $\sigma$ is the variance of the velocity vectors regarding the direction and/or the velocity, and $\sigma_{max}$ is the maximum variance of all cells.

The evidence mass for the cells that describes that cells cannot be assigned, results from the following formula:

$$m(\Theta)=1-m(S)-m(D).$$

The formulas referenced above apply to the evidence masses for converting the particle card to a first environmental model that, in the following, will be referred to as object environmental model ($m_{S2}$).

In addition, measuring the location of real objects by means of a laser scanner is evaluated to determine whether a free space is found in the respective locations. Locations assessed as a free space are locations found in the area between a sensor and a real object. On the basis on this evaluation, a second environmental model ($m_{S1}$) is generated in which at least evidence masses are assigned to the cells that represent the evidence as a free space. For this purpose, the points measured in the three-dimensional space are projected onto a two-dimensional occupancy grid. Preferably, the individual points are expanded in the occupancy grid by a Gaussian distribution to take measuring inaccuracies into account. Predetermined evidences are assigned to the cells located in the area between a sensor and the points. The amount of the evidence may depend on a plurality of parameters, in particular when the points in the occupancy grid are represented by probabilities, for example, when they are entered by means of a Gaussian distribution, then the evidence is proportional to the respective probability. Furthermore, higher evidence masses may be assigned near the sensors because measuring near a sensor is more reliable than at a great distance.

Object environmental model ($m_{S2}$) and free-space environmental model ($m_{S1}$) are combined in the following formula:

$$m_s(A) = (m_{S1} \oplus m_{S2})(A) = \sum_{B \cap C = A} m_{S1}(B) m_{S2}(C).$$

This corresponds with step DR in FIG. 1 to generate the environmental model $m_S$. The environmental model $m_S$ combined in such a manner, thus, includes evidences for the presence of static objects, dynamic objects, the free space and cells that cannot be assigned. This environmental model $m_S$ is also referred to as sensor environmental model because the sensor measurements flow directly into this environmental model.

Furthermore, a historical environmental model $m_{t-1}$ at time step t−1 is taken into account.

In the historical environmental model, first the dynamic evidence masses are added to the evidence masses for the free space according to the following formula:

$$m_{t-1}(F)=m_{t-1}(F)+m_{t-1}(D)$$

Then, the dynamic evidence masses are deleted.

$$m_{t-1}(D)=0$$

Then, all evidence masses of the historical environmental model are linked with the corresponding evidence masses of the sensor environmental model according to the following formulas:

$$m(A) \atop A \subset \Theta \backslash \{D, \phi\} = w \frac{m_{t-1}(A)m_S(\Theta) + m_{t-1}(\Theta)m_S(A)}{m_{t-1}(\Theta) + m_S(\Theta) - m_{t-1}(\Theta)m_S(\Theta)}$$

$$m_t(\Theta) = w \frac{m_{t-1}(\Theta)m_S(\Theta)}{m_{t-1}(\Theta) + m_S(\Theta) - m_{t-1}(\Theta)m_S(\Theta)},$$

and A is any subset of $\theta$ but without that the dynamic objects and the following normalization weight w is applied:

$$w = \frac{(1 - m_S(D))(m_{t-1}(\Theta) + m_S(\Theta) - m_{t-1}(\Theta)m_S(\Theta))}{\sum_{A \subset \Theta \backslash \{D, \phi\}} m_{t-1}(A)m_S(\Theta) + m_{t-1}(\Theta)m_S(A)}.$$

This is a weighted version of Jøsang's cumulative operators. This operator corresponds with the Bayesian filter in the evidence theory according to Dempster and Shafer.

The evidence masses calculated in this manner form an environmental model $m_t$ at time step t. The dynamic evidence masses $m_S(D)$ of the sensor environmental model are entered directly into this environmental model.

Therefore, the environmental model $m_t$ is based on measured sensor data on the one hand but also on historical data on the other. By reconciling the environmental model $m_t$ with the measured sensor data, it is ensured that the environmental model matches reality and is robust in relation to sensor noise and error detections. Using static particles makes it possible to reproduce static objects reliably. Taking into account the measured free space significantly increases the quality of the environmental model. Using such data results in not losing information from the past. This information concerns the free space and static objects which, as a matter of principle, do not change temporally.

Owing to the historical data, the environmental model converges very precisely in regard to the static objects and the free space after fewer time steps.

The method described above has been tested in the real environment. For this purpose, a vehicle has been equipped with a laser scanner that has been installed under the front license plate of the vehicle. The raster resolution was set to 512×512, having a cell size of 0.2 m. The speed range of the particle card was set to +/−70 km/hour, the frequency of static particles to 0.3, and the frequency of dynamic, uniformly distributed particles to 0.7, and the probability of survival of the particles to 0.5. The maximum number of particles per cell was limited to 50. The environmental model was able to be calculated in real time. With this method it was possible to reliably detect moving motor vehicles and cyclists as well as static objects. Taking into account the historical information and the modeling of the dynamic objects in the particle card made it possible to track objects successfully, even when they were concealed in the short term. This applies particularly to the area of intersections in which vehicles, cyclists and pedestrians move in the most different directions and, at the same time, when static objects, for example, poles for traffic lights are present.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for detecting static and dynamic objects and controlling a vehicle, the method comprising the acts of:
   a) distributing new particles in a particle card at a specific time step (t), wherein the particle card is a two-dimensional arrangement of cells and each cell represents a specific location, each particle is depicted by a velocity vector, and the new particles are distributed in the particle card by a random process;
   b) calculating a location of the particles at a later point-in-time (t+Δt) by a predetermined time step (Δt) vis-a-vis the specific point-in-time (t) from step a) and assigning the particles to the cells of the particle card that correspond to the newly calculated location;
   c) measuring a location of real objects via a sensor in an area including the locations of the particle card;
   d) filtering the particles in the individual cells as a function of the objects measured, and in the cells in which no object was measured more particles are deleted than in cells in which an object is located;
   e) repeating steps a) through d) and, in step a), adding new particles to the particles not deleted in step d),
   wherein in step a), static particles having zero velocity are also added, and
   f) detecting in real-time the location and velocity of the static and dynamic objects and controlling the vehicle in a partially automated or fully automated manner based on the detection, and
   wherein the cells of the particle card are classified as cells including: (i) static objects when their particles have a velocity variance and/or a direction variance that is greater than a first predetermined threshold value and (ii) dynamic objects when their particles have the velocity variance and/or the direction variance that is less than a second predetermined threshold value, the second predetermined threshold value being smaller than the first predetermined threshold value.

2. The method according to claim 1, wherein
   in step a), the non-static particles are distributed with a predetermined velocity distribution.

3. The method according to claim 1, wherein
   after measuring the location of real objects in step c), in step a) only new particles are distributed in cells in which a real object has been measured.

4. The method according to claim 1, wherein
   weights are assigned to the particles, wherein the weights represent a probability by which the particles are not deleted when filtering in step d).

5. The method according to claim 4, wherein
   the weights are assigned as a function of a velocity measured at the corresponding objects and/or as a function of the life span of the individual particles.

6. A method for detecting static and dynamic objects and controlling a vehicle, the method comprising the acts of:
   measuring a location of real objects by a sensor;
   generating an environmental model that has a two-dimensional arrangement of cells and each cell represents a specific location, and at least two continuous classification values, describing the probability of a respective cell being assigned to a specific class, are assigned to the cells for respectively one specific time step (t), wherein in particular two or more of the following classes are differentiated as to:
   whether the cell has an object;
   whether the cell has a static object;
   whether the cell has a dynamic object;
   whether the cell represents a free space; and
   whether the cell cannot be assigned to any of the aforementioned classes; and
   detecting in real-time the location and velocity of the static and dynamic objects and controlling the vehicle in a partially automated or fully automated manner based on the detection, and
   wherein the cell is classified as a cell including: (i) the static object when a velocity variance and/or a direction variance is greater than a first predetermined threshold value and (ii) the dynamic object when the velocity variance and/or the direction variance is less than a second predetermined threshold value, the second predetermined threshold value being smaller than the first predetermined threshold value.

7. The method according to claim 6, wherein
   the classification values are probabilities or evidence masses.

8. The method according to claim 6, wherein
measuring the location of real objects is evaluated according to free space, wherein locations in the area between a sensor and a real object are assessed as free space and classification values are generated accordingly for the class whether the cell represents a free space.

9. The method according to claim 6, wherein
a particle card represents a measurement of the locations of the real objects and is converted to an environmental model that includes at least classification values for the classes:
whether the cell has a static object; and
whether the cell has a dynamic object,
wherein the particle card is a two-dimensional arrangement of cells and each cell represents a specific location, each particle is depicted by a velocity vector, and the new particles are distributed in the particle card by a random process.

10. The method according to claim 9, wherein
the cells of the particle card are classified as cells including static objects when their particles have an average velocity less than a third predetermined threshold value.

11. The method according to claim 10, wherein
at a specific time step (t), classification values filtered with a time filter flow from the environmental model at the previous time step (t−1) into the environmental model.

12. The method according to claim 11, wherein
before filtering with the time filter in the environmental model at the previous time step (t−1), classification values for dynamic objects are assigned to the classification values for the free space and the classification values for dynamic objects are deleted.

13. The method according to claim 12, wherein
classification values for cells including dynamic objects and derived from the particle card are entered directly into the environmental model at a specific time step (t).

14. A system for detecting static and dynamic objects and controlling a vehicle, comprising a sensor for detecting the location of the objects, and a control device configured to execute a program to:

a) distribute new particles in a particle card at a specific time step (t), wherein the particle card is a two-dimensional arrangement of cells and each cell represents a specific location, each particle is depicted by a velocity vector, and the new particles are distributed in the particle card by a random process;
b) calculate a location of the particles at a later point-in-time (t+Δt) by a predetermined time step (Δt) vis-a-vis the specific point-in-time (t) from step a) and assign the particles to the cells of the particle card that correspond to the newly calculated location;
c) measure a location of real objects via a sensor in an area including the locations of the particle card;
d) filter the particles in the individual cells as a function of the objects measured, and in the cells in which no object was measured more particles are deleted than in cells in which an object is located;
e) repeat steps a) through d) and, in step a), add new particles to the particles not deleted in step d),
wherein
in step a), static particles having zero velocity are also added, and
f) detect in real-time the location and velocity of the static and dynamic objects and control the vehicle in a partially automated or fully automated manner based on the detection, and
wherein the cells of the particle card are classified as cells including: (i) static objects when their particles have a velocity variance and/or a direction variance that is greater than a first predetermined threshold value and (ii) dynamic objects when their particles have the velocity variance and/or the direction variance that is less than a second predetermined threshold value, the second predetermined threshold value being smaller than the first predetermined threshold value.

15. The system according to claim 14, further comprising a sensor for detecting the velocity of the objects.

* * * * *